(12) United States Patent
Zheng et al.

(10) Patent No.: US 9,088,126 B2
(45) Date of Patent: Jul. 21, 2015

(54) SINGLE-MODE QUANTUM CASCADE LASERS WITH ENHANCED TUNING RANGE

(71) Applicant: Princeton University, Princeton, NJ (US)

(72) Inventors: Mei Chai Zheng, Princeton, NJ (US); Qiang Liu, Zurich (CH); Claire F. Gmachl, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 14/056,383

(22) Filed: Oct. 17, 2013

(65) Prior Publication Data

US 2015/0110137 A1    Apr. 23, 2015

(51) Int. Cl.
   *H01S 5/06*  (2006.01)
   *H01S 5/34*  (2006.01)
   *B82Y 20/00* (2011.01)

(52) U.S. Cl.
   CPC .............. *H01S 5/06* (2013.01); *H01S 5/3401* (2013.01); *B82Y 20/00* (2013.01); *Y10S 977/951* (2013.01)

(58) Field of Classification Search
   CPC ..... H01S 3/1003; H01S 5/06; H01S 5/06206; H01S 5/3401
   USPC .......................................................... 372/20
   See application file for complete search history.

(56) References Cited

U.S. PATENT DOCUMENTS

| | | | |
|---|---|---|---|
| 5,901,168 A | 5/1999 | Baillargeon et al. | |
| 6,055,254 A | 4/2000 | Capasso et al. | |
| 6,055,257 A | 4/2000 | Baillaargeon et al. | |
| 6,091,753 A | 7/2000 | Capasso et al. | |
| 6,134,257 A | 10/2000 | Capasso et al. | |
| 6,137,817 A | 10/2000 | Baillargeon et al. | |
| 6,148,012 A | 11/2000 | Capasso et al. | |
| 6,278,134 B1 | 8/2001 | Capasso et al. | |
| 6,301,282 B1 | 10/2001 | Capasso et al. | |
| 6,324,199 B1 | 11/2001 | Capasso et al. | |
| 6,326,646 B1 | 12/2001 | Baillargeon et al. | |
| 6,333,944 B1 | 12/2001 | Capasso et al. | |
| 6,463,088 B1 | 10/2002 | Baillargeon et al. | |
| 6,501,783 B1 | 12/2002 | Capasso et al. | |
| 6,556,604 B1 | 4/2003 | Capasso et al. | |
| 6,563,852 B1 | 5/2003 | Baillargeon et al. | |
| 6,728,282 B2 | 4/2004 | Capasso et al. | |
| 6,760,354 B2 | 7/2004 | Capasso et al. | |
| 6,795,467 B2 | 9/2004 | Capasso et al. | |
| 6,816,530 B2 | 11/2004 | Capasso et al. | |
| 6,836,499 B2 | 12/2004 | Capasso et al. | |
| 6,882,675 B2 | 4/2005 | Gmachl et al. | |
| 6,940,639 B1 | 9/2005 | Belyanin et al. | |
| 7,010,010 B2 | 3/2006 | Capasso et al. | |
| 7,092,421 B2 | 8/2006 | Capasso et al. | |
| 7,570,320 B1 * | 8/2009 | Anderson et al. | 349/63 |
| 8,644,358 B2 | 2/2014 | Liu et al. | |
| 2002/0159702 A1 * | 10/2002 | Liu et al. | 385/40 |
| 2003/0128415 A1 * | 7/2003 | Kalluri et al. | 359/238 |

OTHER PUBLICATIONS

Liu et al., "Single-mode quantum cascade lasers employing asymmetric Mach-Zehnder interferometer type cavities", Applied Physics Letters, vol. 101, Issue 16, Oct. 15, 2012.*
Paldus, B.A. et al., Photoacoustic Spectroscopy Using Quantum-Cascade Lasers, Optical Society of America, Optics Letters, Feb. 1, 1999, vol. 24, No. 3, pp. 178-180.
Curl, Robert F. et al Quantum Cascade Lasers in Chemical Physics, Chemical Physics Letters, Jan. 4, 2010, pp. 1-18.
Liu, Peter Q. et al., Highly Power-Efficient Quantum Cascade Lasers, Nature Photonics, vol. 4, Feb. 2010, pp. 95-98.
Liu, Peter Q. et al., Single-mode Quantum Cascade Lasers Based on a Folded Fabry-Perot Cavity, American Institute of Physics 2011, Applied Physics Letters 98, pp. 061110-1-061110-3.
Hoffmann, L.K. et al., Monolithic Mach-Zehnder-type Quantum Cascade Laser, Journal of Applied Physics 104, American Institute of Physics 2008, pp. 063110-1-063110-6.

* cited by examiner

*Primary Examiner* — Xinning Niu
(74) *Attorney, Agent, or Firm* — J. Clinton Wimbish; Smith Moore Leatherwood LLP (57) ABSTRACT

In one aspect, semiconductor lasers are provided. A semiconductor laser described herein comprises substrate and a cavity formed on the substrate, the cavity comprising an asymmetric Mach-Zehnder (AMZ) interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm.

23 Claims, 6 Drawing Sheets

SINGLE-MODE QUANTUM CASCADE LASERS WITH ENHANCED TUNING RANGE

STATEMENT OF GOVERNMENT RIGHTS

The present invention was made with government support under National Science Foundation Grant Number EEC-0540832, the Department of Defense, Air Force Office of Scientific Research Grant Number FA9550-11-C-0028 and the National Defense Science and Engineering Graduate Fellowships pursuant to 37 C.F.R. §168a. The United States Government has certain rights to the present invention.

FIELD

The present invention relates to semiconductor lasers and, in particular, to quantum cascade lasers demonstrating enhanced tuning ranges and methods of achieving the same.

BACKGROUND

Quantum cascade (QC) lasers are powerful and compact semiconductor light sources. In the mid-infrared, they are currently highly advantageous light sources for applications in absorption-based spectroscopic systems in molecular sensing. As these systems make use of strong and narrow absorption lines of different gas molecules, they require the QC laser to operate in single-mode and be continuously tunable. Various methods of achieving wavelength selectivity and tunability have been investigated and implemented. Until recently, most single-mode operation of QC lasers has been achieved by incorporating periodic gratings on top of the regular Fabry-Perot QC lasers, such as distributed feedback gratings or distributed Bragg reflectors. However, the necessity for precise periodic structures on the wavelength scale requires complex fabrication steps, such as electron beam lithography, often resulting in higher fabrication costs and lower yield. Further, mechanically movable gratings have been incorporated into external cavities to enable wide range single-mode tuning. Nevertheless, wavelength selection and tuning in such a configuration requires system integration and stringent optical alignment. Problems, therefore, persist in providing continuously tunable single-mode QC lasers having simplified fabrication and desirable performance.

SUMMARY

In one aspect, single-mode semiconductor lasers, including QC lasers, are described herein which offer advantages over prior laser architectures. Single-mode semiconductor lasers described herein, for example, can be fabricated by simplified techniques while providing enhancements in single-mode tuning range. Briefly, a single-mode semiconductor laser described herein comprises substrate and a cavity formed on the substrate, the cavity comprising an asymmetric Mach-Zehnder (AMZ) interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm. In some embodiments, the temperature control architecture of the second arm comprises one or more electrical contacts for biasing the second arm independent of the first arm.

In another aspect, methods of tuning single-mode semiconductor laser emission are described herein. A method of tuning single-mode semiconductor laser emission comprises providing a single-mode laser including as substrate and a cavity formed on the substrate, the cavity comprising an AMZ interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm. The temperature of the second arm is changed independently from the first arm to alter the single-mode emission wavelength of the laser. As discussed further herein, the temperature control architecture of the second arm, in a non-limiting embodiment, comprises one or more electrical contacts for biasing the second arm independent of first arm bias. Consequently, temperature of the second arm can be separately controlled or varied by biasing at a DC current different from the first arm, thereby permitting the modal refractive indices of the two AMZ interferometer arms to be tuned independently. Such tuning configurations permit a broader variety of phase relations on the two interferometer arms and thereby allow the semiconductor laser to emit wavelengths that cannot be obtained with a single biasing current common to both arms.

These and other embodiments are described further in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Single-Mode Semiconductor Lasers

A single-mode semiconductor laser described herein comprises a substrate and a cavity formed on the substrate, the cavity comprising an AMZ interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm. In some embodiments, the temperature control architecture of the second arm comprises one or more electrical contacts for biasing the second arm independent of the first arm.

Figure 1:
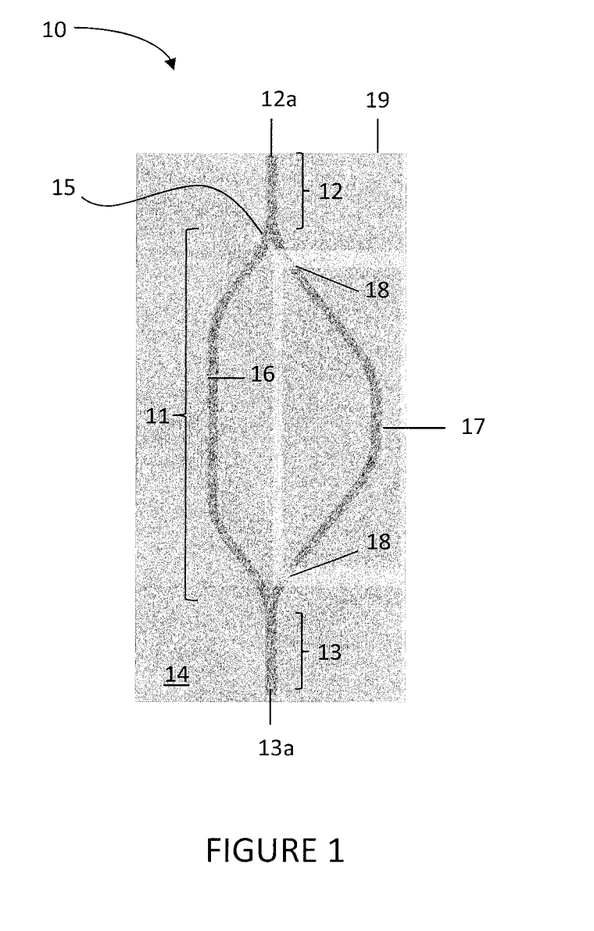
FIG. 1 is a schematic of a single-mode AMZ-QC laser according to one embodiment described herein.

FIG. 1 is a schematic top view of a single-mode AMZ-QC laser according to one non-limiting embodiment described herein. As illustrated in FIG. 1, the single-mode AMZ-QC laser (10) employs a cavity comprising an AMZ interferometer structure (11) positioned between two straight waveguide segments (12, 13) on a substrate (14). Straight waveguide segments (12, 13) are monolithically coupled to the AMZ interferometer structure (11) by locally symmetric Y-splitter structures (15). In some embodiments, each Y-splitter structure (15) can display a sufficiently large bending radius of the splitting branches to allow for adiabatic transitions and, therefore, minimize the coupling loss at interfaces between the Y-splitters (15) and straight waveguide segments (12, 13). The second arm (17) of the AMZ interferometer structure (11) is longer than the first arm (16) and comprises a temperature control architecture independent from the first arm (16). In the embodiment of FIG. 1, the temperature control architecture of the second arm (17) comprises electrical contacts (18) for biasing the second arm (17) independent of the first arm (16). Straight segments (12, 13) terminate at cleaved ends (12a, 13a) formed along the edge (19) of the substrate. Laser light generated in the cavity, including light generated in the AMZ interferometer structure, can be emitted from one of the cleaved ends (12a, 13a), which functions as a facet through which laser light is emitted.

Figure 2:
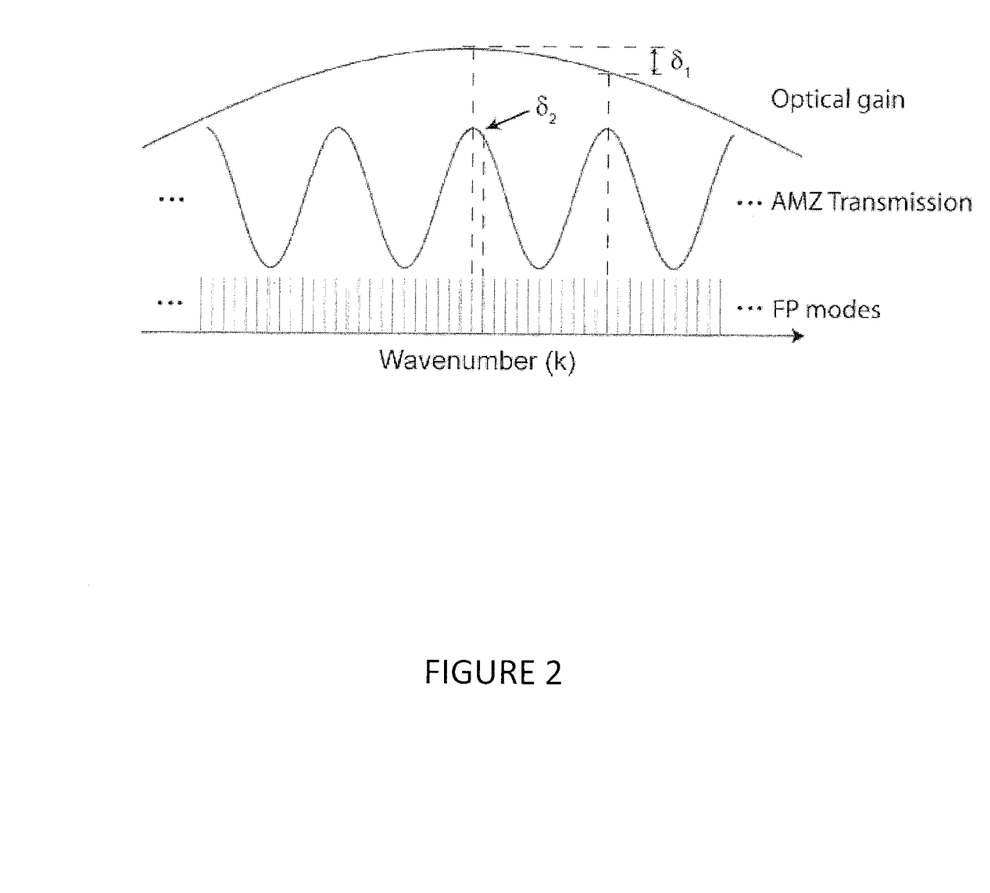
FIG. 2 is a schematic of laser mode selection mechanism in QC lasers with AMZ interferometer type cavities.

In the absence of independent temperature control architectures for the first and second interferometer arms, lasing modes of the AMZ interferometer cavity are selected by three factors: profile of the optical gain, the Fabry Perot (FP) modes of the cavity and the transmission spectrum of the AMZ interferometer. With reference to FIG. 2, if the distance between neighboring transmission peaks of the AMZ interferometer is large enough so that the optical gain discrimination ($\delta_1$) between neighboring transmission peaks is sufficient, only one group of FP modes within the transmission peak closest to the optical gain peak lase. If at the same time, the transmission peak is narrow enough so that transmission loss discrimination ($\delta_2$) between neighboring FP modes within this transmission peak is sufficient, then only the mode with the high transmission lases, leading to single-mode operation in the AMZ-QC laser. Wavelength selectivity of individual transmission peaks and the distance between neighboring peaks change oppositely with respect to the difference in length ($\Delta L$) between the first and second arms of the AMZ interferometer structure of the cavity. When $\Delta L$ is sufficient to satisfy the foregoing mode selection criteria, single-mode emission from the AMZ-QC laser results. For example, in some embodiments, $\Delta L$ has a value selected from Table I.

TABLE I

| $\Delta L$ (μm) of the AMZ Interferometer Structure |
|---|
| ≥300 |
| ≥400 |
| 300-600 |
| 350-500 |

However, tuning of the single-mode emission under these factors is limited to a range of about 2 cm$^{-1}$.

It has been found that employing independent temperature control architectures for the first and second arms of the cavity AMZ interferometer structure can enhance the single-mode tuning range by at least an order of magnitude. As discussed further herein, the AMZ-QC architecture of FIG. 1 allows temperature of the second arm to be separately controlled or varied by biasing the second arm at a DC current different from the first arm and remainder of the cavity structure, thereby permitting the modal refractive indices of the two interferometer arms to be tuned independently yielding longitudinal modes not previously accessible.

With reference to FIG. 1, when light of wavenumber k enters the AMZ interferometer and is split equally into the first and second arms (16, 17), the wave traveling in the first arm (16) will accumulate a phase of $2\pi k_m n_1^{eff} L_1$, and the wave traveling in the second arm will accumulate a phase of $2\pi k_m n_2^{eff} L_2$, where $L_1$, $L_2$ are the respective lengths of first (16) and second (17) arms and $n_{1,2}^{eff}$ are the temperature dependent effective refractive indices of the corresponding arms. The relative phase difference between the first (16) and second (17) arms when they recombine at the end of the AMZ interferometer is $\Delta\phi=2\pi k_m(n_2^{eff} L_2 - n_1^{eff} L_1)$. The waves will constructively interfere when this phase difference is an integer of $2\pi$, i.e. $2\pi N$, where N is an integer. Minimal transmission through the AMZ interferometer occurs when the waves destructively interfere [i.e. when $\Delta\phi=(2N+1)\pi$]. Application of separate DC currents to the first (16) and second (17) arms of the AMZ interferometer structure (11) permits the temperature dependent refractive indices of the arms to be tuned independently, resulting in tuning of the laser mode and emission wavelength. Applying the constructive interference condition to the phase difference and solving for the change in wavelength as a function of temperature of the first (16) and second (17) arms yields equation (1):

$$\partial \lambda = \frac{1}{N}\left(L_2 \frac{\partial n_2^{eff}}{\partial T}\Delta T_2 - L_1 \frac{\partial n_1^{eff}}{\partial T}\Delta T_1\right) \quad (1)$$

where $$\lambda = \frac{1}{k_m}.$$

Therefore, for a laser with a fixed arm length difference $(L_2-L_1)$ or ($\Delta L$) under the condition that $L_1$ and the straight waveguide segments (12, 13) are held at constant temperature, the greatest tuning range can be achieved when the length of the separately biased section of the second arm, $L_2$, is maximized. As illustrated in the Examples below, tuning range of an AMZ-QC laser having independent temperature control architectures described herein can provide an enhanced single-mode tuning range of 20 cm$^{-1}$, an order of magnitude increase over AMZ-QC lasers not employing independent temperature control architectures for the interferometer arms.

Further, the tuning rate of an AMZ-QC laser demonstrating the structure wherein the second arm has a temperature control architecture independent of the first arm is given by equation (2):

$$\frac{\Delta \lambda}{\Delta T_2} \propto \frac{\partial n_2^{eff}}{\partial T} L_2. \quad (2)$$

In contrast, an AMZ-QC laser having architecture wherein temperatures of the first and second arms are not varied independently but instead reflect substantially equal temperature values displays a tuning rate given by:

$$\frac{\Delta \lambda}{\Delta T} \propto \frac{\partial n_2^{eff}}{\partial T} \Delta L. \quad (3)$$

Such an AMZ-QC laser, for example, can demonstrate an architecture where first and second arms do not have separate contacts and are, therefore, provided the same DC current under a common or shared contact structure. From examination of equations (2) and (3), it can be seen that an AMZ-QC laser having independent temperature control of the first and second arms will provide a faster tuning rate as $L_2$ is greater than $\Delta L$ and the local change in temperature of the second arm ($\Delta T_2$) exceeds the global temperature change of the AMZ interferometer structure ($\Delta T$).

It is important to note that use of separate electrical contacts as illustrated in FIG. 1 for biasing the second interferometer arm independent of the first arm is just one non-limiting example of a temperature control architecture permitting the modal refractive indices of the two AMZ interferometer arms to be tuned independently, yielding longitudinal emission modes not previously accessible. The present invention contemplates any temperature control architecture suitable for operating according to the principles described herein of separately altering/tuning modal refractive indices of the interferometer arms through independent temperature variation. For example, electrically resistive architectures independent of biasing circuitry can be locally applied to the first and/or second interferometer arms and separately driven to induce the desired changes in modal refractive indices. Further, more complex temperature control architectures, including external thermoelectric structures, are also contemplated for independent modal refractive index alteration of the first and/or second interferometer arms.

As described herein, the straight waveguide segments and AMZ interferometer structure positioned therebetween are formed of epitaxial semiconductor layers. In some embodiments, the epitaxial semiconductor layers comprise alternating layers of Group IIIA/VA semiconductor material. Groups of the Periodic Table are listed herein according to the CAS designation. For example, the epitaxial semiconducting layers can comprise alternating layers of indium gallium arsenide and indium aluminum arsenide (InGaAs/InAlAs). In some embodiments, the epitaxial semiconducting layers can have an arrangement and band structure described in U.S. patent application Ser. No. 12/795,954 which is incorporated herein by reference in its entirety.

AMZ-QC lasers described herein can be fabricated using standard III/V semiconductor techniques, including standard ridge laser processing techniques for fabrication of the straight waveguide segments and integrated AMZ interferometer structure. In one embodiment, for example, the QC laser structure can be grown by metal organic chemical vapor deposition (MOCVD) or molecular beam epitaxy (MBE) on an InP substrate using strain balanced $In_{0.66}Ga_{0.34}As/Al_{0.69}In_{0.31}As$ materials and including a low-loss InP-based waveguide cladding on top of the desired repeat number of injector/active region sequencing. The straight waveguide segments and AMZ interferometer structure, for example, can be fabricated using standard ridge-laser processing from the QC laser material. The straight segment ridges and AMZ interferometer structure can be wet etched to a depth of about 8 μm and width of about 8 μm. Arm length difference ($\Delta L$) between the first and second arms of the AMZ interferometer structure can be selected from Table I herein. A $SiO_x$ insulation layer of about 0.3 μm in thickness can be deposited on the straight segment ridges and AMZ interferometer structure with plasma-enhanced chemical vapor deposition (PECVD). Windows are opened in the $SiO_x$ layer along the ridge tops for deposition of thin 30 nm/300 nm titanium-gold top metal contacts through electron beam evaporation. The InP substrate is thinned to about 200 μm and a 20 nm/200 nm germanium-gold bottom metal contact is deposited. Separate electrical contacts for biasing the second arm independent of the first arm are achieved through a lift-off process following the initial deposition of the top metal contacts. Total facet to facet length of the cavity can range from about 1.3-3.0 mm. The straight waveguide segment and AMZ interferometer ridges can be mounted epitaxial side up to copper heat sinks.

EXAMPLES

Figure 3:
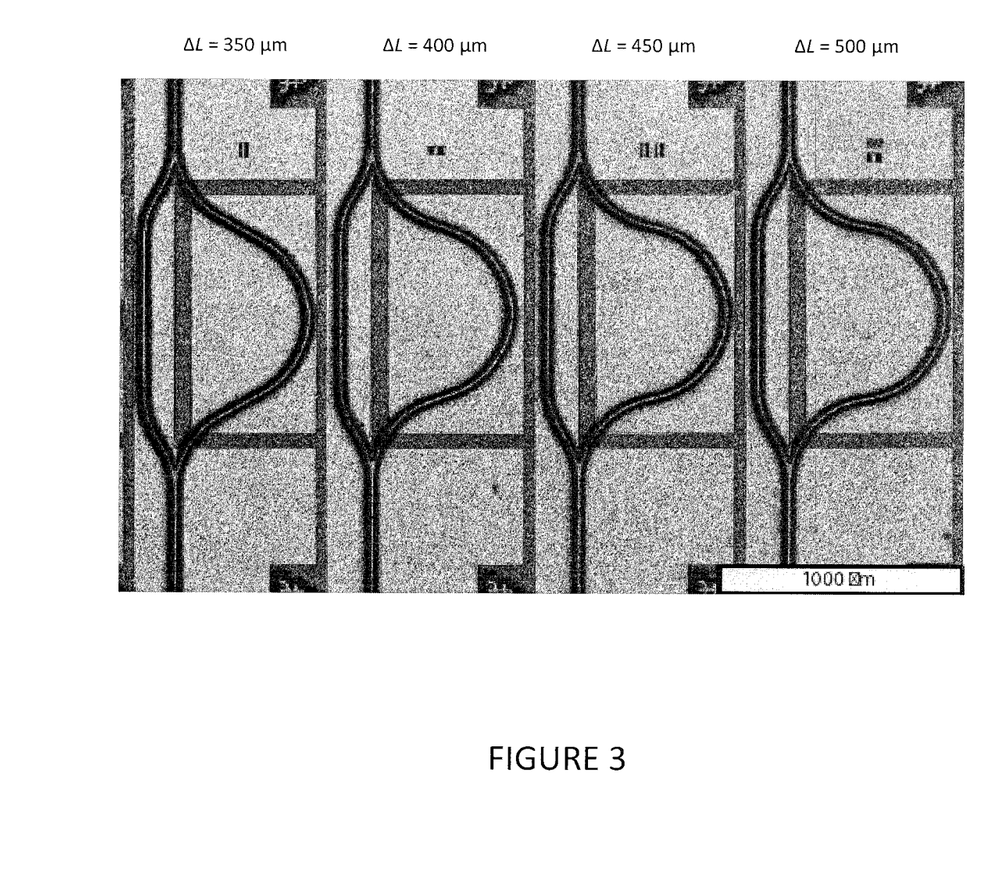
FIG. 3 provides optical microscope images of fabricated AMZ-QC lasers described herein with arm length difference (ΔL) from left to right of 350 µm, 400 µm, 450 µm and 500 µm.
Figure 4:
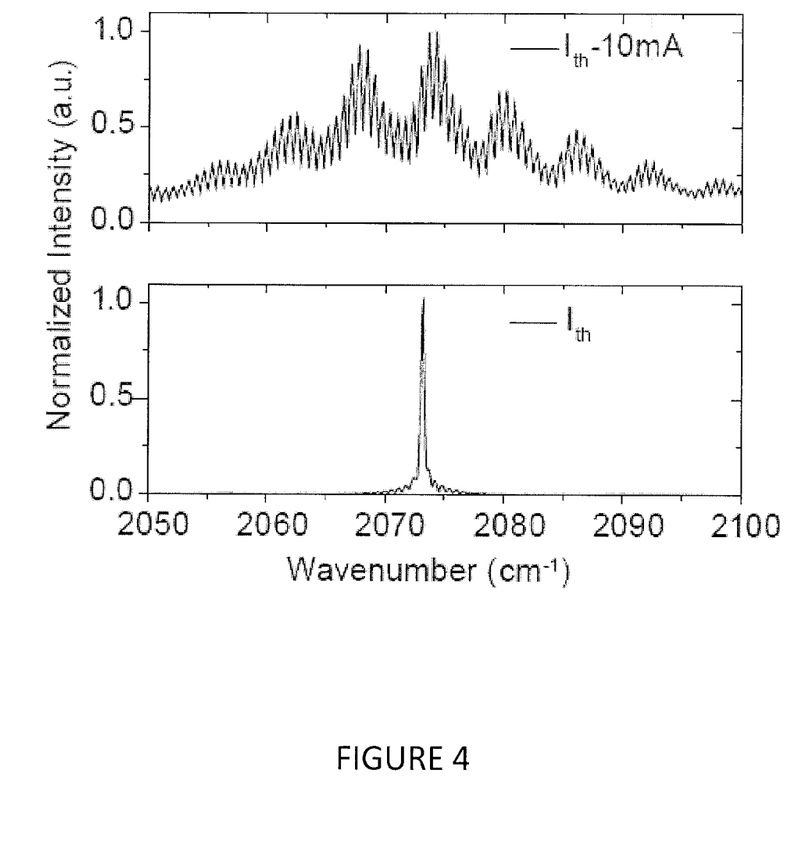
FIG. 4 illustrates amplified spontaneous emission (top panel) and laser spectrum (bottom panel) of an AMZ-QC laser according to one embodiment described herein.

AMZ-QC lasers described herein were constructed according to the foregoing fabrication procedure. FIG. 3 provides optical microscope images of the fabricated AMZ-QC lasers with arm length difference ($\Delta L$) from left to right of 350 μm, 400 μm, 450 μm and 500 μm. Ridge width of each AMZ-QC laser was 8.0±0.2 μm. As illustrated in FIG. 3, the second arm of the AMZ interferometer structure includes separate electrical contacts for independent biasing and temperature variation of the second arm. With this construction, the two arms of the AMZ interferometer were biased by different DC sources and the laser spectra were measured at 80 K with a Fourier Transform Infrared Spectrometer (FTIR). Devices with relatively low threshold current density exhibit single-mode operation in both pulsed mode (100 ns pulse width, 80 kHz repetition rate) and continuous-wave (CW) mode. The sub-threshold amplified spontaneous emission spectrum for the AMZ-QC laser of FIG. 3 with $\Delta L$ of 500 μm and total cavity length of 3.45 mm is displayed in the top panel of FIG. 4. The periodicity envelope of the spectra, ~7 $cm^{-1}$, corresponded to the period of transmission spectrum of the AMZ interferometer. Lasing occurred for the mode that corresponded to the strongest mode in the sub-threshold spectra, which was 2073 $cm^{-1}$, as shown in the bottom panel of FIG. 4.

Figure 5:
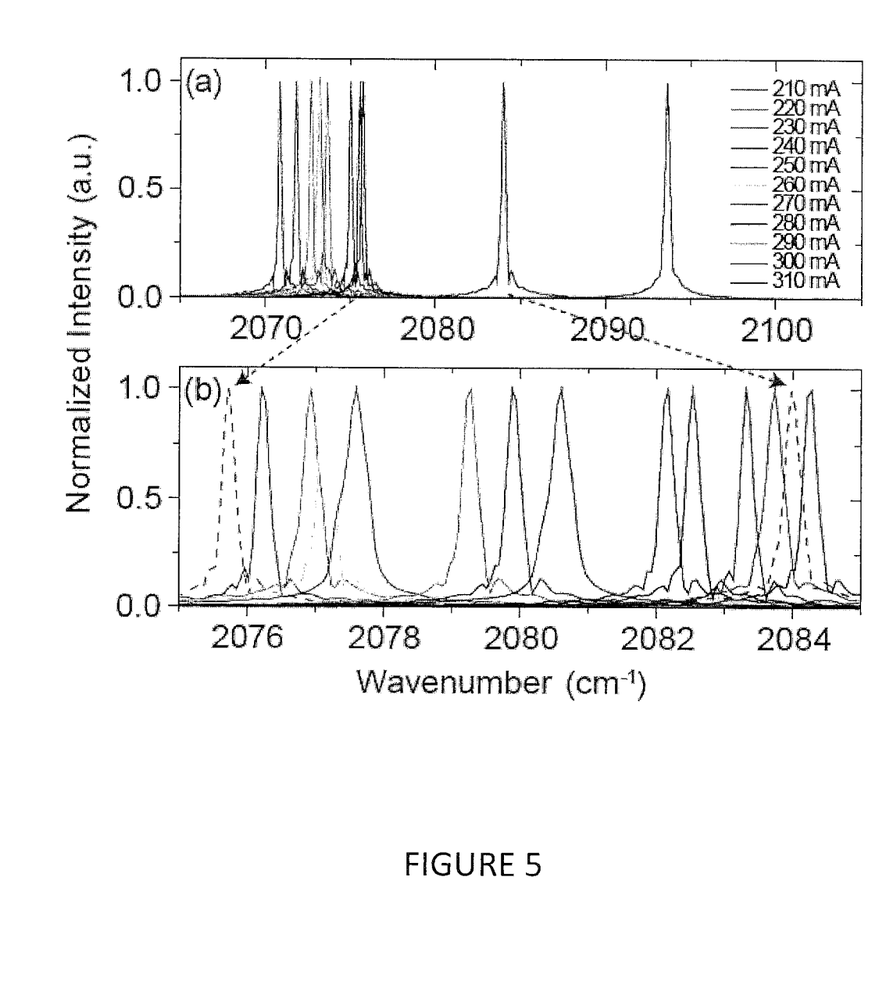
FIG. 5(a) illustrates single-mode lasing spectra of an AMZ-QC laser with ΔL=500 µm at 80 K with both first and second arms of the AMZ interferometer structure under the same DC bias current.
FIG. 5(b) illustrates single-mode lasing spectra for wavenumbers ranging from 2075 cm$^{-1}$ to 2085 cm$^{-1}$ for various configurations of DC currents independently applied to the second arm of the AMZ interferometer structure through separate contacts according to one embodiment described herein.

Single-mode tuning of the AMZ-QC lasers of FIG. 3 was achieved by varying DC current(s). A representative lasing spectrum with both arms under the same DC bias current is displayed in FIG. 5(a). This highest side-mode suppression ratio (SMSR) observed from the AMZ-QC lasers in this mode of operation was close to 30 dB, while typical SMSR was 25 dB. The mode-hop free tuning range with equally biased AMZ interferometer arms was narrow (~2 $cm^{-1}$) and centered about the strongest mode in the subthreshold spectrum. Additional wavelengths in the lasing spectrum were reached via large mode-hops.

Figure 6:
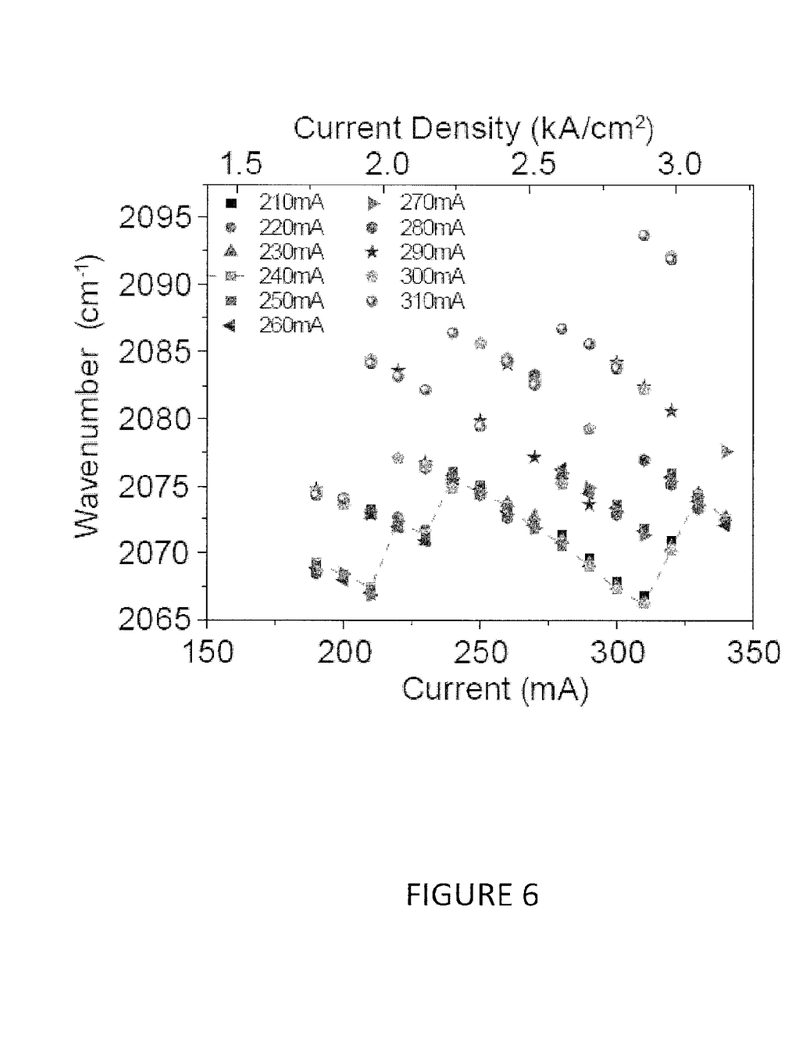
FIG. 6 illustrates single-mode tuning as a function of DC current independently applied to the second arm of the AMZ interferometer structure according to one embodiment described herein.

However, by keeping the first arm of the AMZ interferometer structure and straight waveguide segments at a constant DC current above threshold while altering or tuning the DC current of the second arm, modes originally missed were reached, as illustrated in FIG. 5(b), where previously inaccessible modes (solid lines) between 2075 cm$^{-1}$ and 2084 cm$^{-1}$ are now evident. Using this configuration wherein temperature of the first and second AMZ interferometer arms are independently controlled by separate DC biasing currents, a wide range of single-mode tuning was achieved as demonstrated in FIG. 6. As indicated by the dashed line in FIG. 6 where the first arm and straight waveguide segments were biased at a constant 240 mA and the second arm was biased across a 150 mA range, the emission wavelength was tuned continuously over ~10 cm$^{-1}$. Moreover, the slope of the dashed line showed a tuning rate of $$\frac{\Delta \lambda}{\Delta J} = 0.3 \ \mu m/kA/cm^2,$$

which was five times faster than the tuning rate for the AMZ-QC laser with uniform pumping. The faster tuning rate using independent temperature control architectures through separate electrical contacts for the AMZ interferometer arms can arise from the fact that current applied to the second arm induces a larger change in temperature ($\Delta T_2$) as compared with the temperature gradient ($\Delta T$) induced by a uniform current applied to the entire laser structure. Although mode-hops still existed for the separately biased tuning configuration, once the emission mode-hops to a higher wavenumber, tuning the second arm allowed access to lower wavenumbers missed during the hop. Using different configurations of the two DC currents separately applied to the first and second arms of the AMZ interferometer structure, single-mode emission can be tuned practically continuously for ~20 cm$^{-1}$. Such enhancement in the tuning range can be achieved in continuous-wave mode operation or pulsed mode operation of the AMZ-QC laser. Further, DC current configurations producing a desired wavelength of single-mode emission can be compiled in look-up table(s) for facile operation of the AMZ-QC laser in various analytical applications with differing wavelength requirements.

II. Methods of Tuning Single-Mode Semiconductor Laser Emission

In another aspect, methods of tuning single-mode semiconductor laser emission are described herein. A method of tuning single-mode laser emission comprises providing a single-mode semiconductor laser including as substrate and a cavity formed on the substrate, the cavity comprising an AMZ interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm. The temperature of the second arm is changed independently from the first arm to alter the single-mode emission wavelength of the laser. As discussed herein, the temperature control architecture of the second arm, in a non-limiting embodiment, comprises one or more electrical contacts for biasing the second arm independent of first arm bias. Consequently, temperature of the second arm can be separately controlled or varied by biasing at a DC current different from the first arm, thereby permitting the modal refractive indices of the two AMZ interferometer arms to be tuned independently. As shown in Section I above, independent tuning of the modal refractive indices can permit tuning of single mode emission continuously over a range of ~20 cm$^{-1}$.

AMZ-QC lasers suitable for use in methods described herein can demonstrate constructions and/or properties described in Section I above. Further, the AMZ-QC lasers can operate according to the principles set forth in Section I and FIGS. 1-6 for providing tunable single-mode emission.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A single-mode laser comprising:
a substrate; and
a cavity formed on the substrate, the cavity comprising an asymmetric Mach-Zehnder (AMZ) interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm operable for expanding a single-mode emission tuning range of the single-mode laser, wherein the expanded single-mode emission tuning range covers 20 cm$^{-1}$.

2. The single-mode laser of claim 1, wherein the temperature control architecture of the second arm comprises one or more electrical contacts for biasing the second arm independent of biasing the first arm.

3. The single-mode laser of claim 1, wherein the single-mode laser is a quantum cascade laser.

4. The single-mode laser of claim 1, wherein the second arm is longer than the first arm.

5. The single-mode laser of claim 1, wherein the second arm is longer than the first arm by at least 300 μm.

6. The single-mode laser of claim 1, wherein the second arm is longer than the first arm by 300 μm to 500 μm.

7. The single-mode laser of claim 1, wherein light is generated in the cavity and emitted at a straight waveguide segment end.

8. The single-mode laser of claim 1, wherein single-mode tuning is substantially continuous over the range of 20 cm$^{-1}$.

9. The single mode laser of claim 1, wherein the epitaxial semiconducting layers comprise alternating layers of III/V semiconductor material.

10. The single mode laser of claim 1, wherein the alternating layers comprise indium gallium arsenide and indium aluminum arsenide.

11. The single mode laser of claim 1, wherein locally symmetric Y-splitter structures join the straight waveguide segments to the AMZ interferometer structure.

12. A method of tuning laser emission comprising:
providing a single-mode semiconductor laser including a substrate and a cavity formed on the substrate, the cavity comprising an asymmetric Mach-Zehnder (AMZ) interferometer structure positioned between two straight waveguide segments, the straight waveguide segments and first and second arms of the AMZ interferometer structure comprising epitaxial semiconductor layers, wherein the second arm of the AMZ interferometer structure has a temperature control architecture independent of the first arm; and changing temperature of the second arm independently from the first arm to alter single-mode emission wavelength over a range of 20 cm$^{-1}$.

13. The method of claim 12, wherein the temperature control architecture comprises one or more electrical contacts for biasing the second arm independent of biasing the first arm.

14. The method of claim 13, wherein the second arm is biased at a different DC current than the first arm.

15. The method of claim 13, wherein the first arm is maintained at a constant temperature by biasing at a constant DC current, and the temperature of the second arm is changed by independently biasing the second arm at a DC current different from the constant DC current of the first arm.

16. The method of claim 15, wherein the straight waveguide segments are biased at the constant DC current of the first arm.

17. The method of claim 15, wherein the DC current of the second arm increases the single-mode emission wavelength of the laser.

18. The method of claim 15, wherein the DC current of the second arm decreases the single-mode emission wavelength of the laser.

19. The method of claim 14, wherein increasing the DC current on the first arm decreases the single-mode emission wavelength of the laser.

20. The method of claim 14, wherein the DC current of the first arm and DC current of the second arm are selected from a look-up table to produce a desired single-mode emission wavelength from the laser.

21. The method of claim 12, wherein the single mode laser is a quantum cascade laser.

22. The method of claim 12, wherein the second arm is longer than the first arm by at least 300 µm.

23. The method of claim 12, wherein the epitaxial semiconductor layers comprise alternating layers of III/V semiconductor material.

* * * * *